US012797960B2

(12) United States Patent
Liebig et al.

(10) Patent No.: US 12,797,960 B2
(45) Date of Patent: *Nov. 17, 2026

(54) COATED CUTTING TOOL

(71) Applicant: WALTER AG, Tubingen (DE)

(72) Inventors: Jan Philipp Liebig, Tubingen (DE); Veit Schier, Tubingen (DE)

(73) Assignee: Walter AG, Tubingen (DE)

( * ) Notice: Subject to any disclaimer, the term of this patent is extended or adjusted under 35 U.S.C. 154(b) by 245 days.

This patent is subject to a terminal disclaimer.

(21) Appl. No.: 18/288,609

(22) PCT Filed: Apr. 29, 2022

(86) PCT No.: PCT/EP2022/061562

§ 371 (c)(1),
(2) Date: Oct. 27, 2023

(87) PCT Pub. No.: WO2022/229427

PCT Pub. Date: Nov. 3, 2022

(65) Prior Publication Data

US 2024/0207945 A1 Jun. 27, 2024

(30) Foreign Application Priority Data

Apr. 30, 2021 (EP) .................................... 21171422
Dec. 14, 2021 (EP) .................................... 21214449

(51) Int. Cl.
*B23B 27/14* (2006.01)
*C23C 14/06* (2006.01)
(Continued)

(52) U.S. Cl.
CPC ........ *B23B 27/148* (2013.01); *C23C 14/0641* (2013.01); *C23C 14/325* (2013.01);
(Continued)

(58) Field of Classification Search
None
See application file for complete search history.

(56) References Cited

U.S. PATENT DOCUMENTS 10,329,671 B2 6/2019 Tatsuoka et al.
11,365,483 B2 6/2022 Stiens et al.
(Continued)

FOREIGN PATENT DOCUMENTS

JP 2017113835 A * 6/2017
JP 2017154239 A 9/2017
(Continued)

*Primary Examiner* — Seth Dumbris
(74) *Attorney, Agent, or Firm* — Corinne R. Gorski

(57) ABSTRACT

A coated cutting tool has at least one rake face and at least one flank face and a cutting edge therebetween. The coated cutting tool includes a substrate and a coating. The coating includes a (Ti,Al)N layer. The (Ti,Al)N layer is either a single monolithic layer or a multilayer of two or more alternating (Ti,Al)N sub-layer types having different compositions. The (Ti,Al)N layer has an overall atomic ratio Al/(Ti+Al) of >0.67 but ≤0.85, wherein the (Ti,Al)N layer shows a plane strain modulus distribution along a direction perpendicular to a cutting edge on the rake face and/or the flank face. The plane strain modulus at a point at a distance of 0.5 mm from a point at the cutting edge is more than 85% of the plane strain modulus at the cutting edge, with the plane strain modulus at the cutting edge being ≥450 GPa.

15 Claims, 9 Drawing Sheets

(51) Int. Cl.
*C23C 14/32* (2006.01)
*C23C 14/34* (2006.01)
*C23C 14/35* (2006.01)

(52) U.S. Cl.
CPC ............ *C23C 14/345* (2013.01); *C23C 14/35* (2013.01); *B23B 2224/24* (2013.01); *B23B 2228/08* (2013.01); *B23B 2228/105* (2013.01); *B23B 2228/36* (2013.01)

(56) References Cited

U.S. PATENT DOCUMENTS

| | | | | |
|---|---|---|---|---|
| 2017/0297117 | A1 | 10/2017 | Tatsuoka et al. | |
| 2018/0029144 | A1* | 2/2018 | Ono | B23B 27/148 |

FOREIGN PATENT DOCUMENTS

| | | | |
|---|---|---|---|
| JP | 2019115957 | A | 7/2019 |
| JP | 2019162709 | A | 9/2019 |
| JP | 2020055097 | A | 4/2020 |
| JP | 2020131424 | A | 8/2020 |
| WO | 2017/150533 | A1 | 9/2017 |
| WO | 2018092791 | A1 | 5/2018 |
| WO | 2019048507 | A1 | 3/2019 |
| WO | 2020254429 | A1 | 12/2020 |

* cited by examiner

COATED CUTTING TOOL

RELATED APPLICATION DATA

This application is a § 371 National Stage Application of PCT International Application No. PCT/EP2022/061562 filed Apr. 29, 2022 with priority to EP 21171422.5 filed Apr. 30, 2021 and EP 21214449.7 filed Dec. 14, 2021.

TECHNICAL FIELD

The present invention relates to a coated cutting tool having a coating comprising a (Ti,Al)N layer with an overall atomic ratio Al/(Ti+Al) of >0.67 but ≤0.85.

BACKGROUND

There is a continuous desire to improve cutting tools for metal machining so that they last longer, withstand higher cutting speeds and/or other increasingly demanding cutting operations. Commonly, a cutting tool for metal machining comprises a hard substrate material such as cemented carbide which has a thin hard wear resistant coating.

When depositing a wear resistant coating the general methods used are chemical vapour deposition (CVD) or physical vapour deposition (PVD). There are limitations on which coatings characteristics that are possible to provide by either method. Even when coatings of the same chemical composition are deposited with either method their properties will vary in terms of, for example, internal residual stress, density, crystallinity and crystal size. Their characteristics and performance in an end-use metal cutting application will therefore be different.

The wear resistant coating usually comprises a layer of, or combination of layers of, a metal nitride, a metal carbonitride or a metal oxide. The origin of a metal element in a coating deposited by a PVD method is a so called "target" in the PVD reactor. Various PVD methods exist, of which the main categories are cathodic arc evaporation and magnetron sputtering. Within the general term "magnetron sputtering" there furthermore exist different methods which differ from each other, such as dual magnetron sputtering (DMS) and High Power Impulse Magnetron Sputtering (HIPIMS).

Titanium aluminium nitride (Ti,Al)N coatings deposited by a PVD method are well-known, as well as their use as wear resistant coatings in metal cutting tools. One type of a PVD (Ti,Al)N coating is a single-layer where the (Ti,Al)N composition is essentially the same throughout the layer. A single-layer coating is provided when the one or more targets used in the deposition process have the same Ti:Al ratio. Another type of a PVD (Ti,Al)N coating is a multilayer where there are (Ti,Al)N sublayers of different composition present in the layer. Such a multilayer can be provided when at least two of the targets used in the deposition process have different Ti:Al ratios so that when the substrate is rotated in the chamber sublayers of different composition are deposited in alternation. A special type of multilayer is a nanomultilayer where the individual layer thicknesses may be as low as only a few nanometers.

The favourable wear resistance performance of (Ti,Al)N coatings stems from their exceptional thermo-mechanical properties, specifically those properties of (Ti,Al)N in its cubic face-centered (fcc) B1 crystal conformation. Such (Ti,Al)N coatings have high oxidation resistance combined with a pronounced age hardening upon spinodal decomposition.

Within the limits of the cubic conformation it is widely accepted that the resistance of (Ti,Al)N to abrasive and adhesive wear as well as oxidation may be further improved by increasing its respective Al-content. However, with increasing Al-concentration the free enthalpy of B1-(Ti,Al)N strongly increases with respect to a mechanically weaker and more compliant hexagonal B4 wurtzite conformation. This makes it increasingly difficult to obtain the preferred cubic structure. Beyond a relative Al-concentration of ≈67% with respect to the metallic portion of the coating, i.e. the Al content out of Ti+Al content, the wurtzite structure is thermodynamically more stable than its cubic counterpart which commonly leads to the deposition of phase mixtures or even predominantly hexagonal coatings with mostly inferior mechanical properties.

In prior art studies generally a lower Al content, such as ≤60 at % of Al+Ti, in (Ti,Al)N gives a single phase cubic structure while a substantial amount of hexagonal structure is seen at an Al content>67 at %, and particularly at an Al content>70 at % of Al+Ti, in (Ti,Al)N. Prior art studies have reported a specific limit of the level of Al content for giving a single phase cubic structure but they vary to some extent depending on, for example, the deposition conditions in the PVD process.

One principal means to stretch the phase field of the cubic B1 structure to higher Al-concentrations is increasing the ion bombardment during deposition. This phenomenon can be commonly observed around the cutting edge of cutting inserts where the coating structure is often significantly coarser and harder than at larger distances from the cutting edge. Here, the local concentration of the electrical field lines effectively causes an elevation of the bias potential during deposition. Due to the increased kinetic energy of the incident ions hexagonal wurzite B4 nuclei of subcritical size may be readily resputtered from the surface leaving the more resistant cubic nuclei to grow into larger B1 grains. However, to ensure reliable performance in all applications and with respect to all wear forms (including crater wear), it is mandatory to produce predominantly cubic coatings over a wide region around the cutting edge. That means as far as 0.5 mm from the cutting edge, or even 1 mm from the cutting edge, on both the flank face as well as the rake face of the cutting edge. Unfortunately, a simple increase in the applied bias potential will not solve this requirement. This is again due to the local elevation of the electrical potential. Once the energy of ions hitting the remote cutting face (0.5 mm from the cutting edge, or even 1 mm from the cutting edge) is high enough to stabilize a cubic deposition in that region, the increased residual stresses caused by the elevated ion bombardment at the cutting edge will already cause a delamination of the coating.

Overall, the aforementioned limitations give rise to the fact that commercially available and state of the art (Ti,Al)N coatings can be classified into two groups. One group includes (Ti,Al)N coatings of conventional Al-content (here defined as the Al content out of Ti+Al content being <67%) that features a predominantly cubic structure over the entire insert and thus constant mechanical properties independent of measurement position. The second group includes (Ti,Al)N coatings of high Al-content (the Al content out of Ti+Al content being ≥67%) that may partially exhibit a more cubic structure confined only along the cutting edge but otherwise constitute dispersed phase mixtures of cubic and hexagonal phases with unfavorable mechanical properties.

OBJECT OF THE INVENTION

The object of the present invention is to provide a coated cutting tool having a coating comprising a (Ti,Al)N layer with an overall atomic ratio Al/(Ti+Al) of >0.67 but ≤0.85 showing excellent wear resistance, such as excellent flank wear resistance and/or excellent crater wear resistance.

THE INVENTION

It has now been provided a coated cutting tool for metal cutting which satisfies the above-mentioned object. The coated cutting tool having at least one rake face and at least one flank face and a cutting edge inbetween, the coated cutting tool comprising a substrate and a coating, the coating comprises a (Ti,Al)N layer, the (Ti,Al)N layer is either a single monolithic layer or a multilayer of two or more alternating (Ti,Al)N sub-layer types different in their composition, the (Ti,Al)N layer having an overall atomic ratio Al/(Ti+Al) of >0.67 but ≤0.85, wherein the (Ti,Al)N layer shows a plane strain modulus distribution along a direction perpendicular to a cutting edge on the rake face and/or the flank face, the plane strain modulus at a point at a distance of 0.5 mm from a point at the cutting edge is more than 85%, suitably more than 90%, preferably more than 95%, of the plane strain modulus at the cutting edge, the plane strain modulus at the cutting edge being ≥450 GPa.

The plane strain modulus at a point at a distance of 0.5 mm from a point at the cutting edge is suitably up to 100% of the plane strain modulus at the cutting edge.

The cutting edge of the coated cutting tool is located inbetween the rake face and the flank face. The cutting edge has a rounded portion, as seen in a cross sectional view of the cutting edge, and by the term "at the cutting edge" is herein meant a location on the rake face and/or the flank face of the coated cutting tool at the beginning of the rounded portion.

In one embodiment, the plane strain modulus at a point at a distance of 1 mm from a point at the cutting edge is more than 85%, suitably more than 90%, preferably more than 95%, of the plane strain modulus at the cutting edge.

The plane strain modulus at a point at a distance of 1 mm from a point at the cutting edge is suitably up to 100% of the plane strain modulus at the cutting edge. In one embodiment, the (Ti,Al)N layer shows a hardness distribution along a direction perpendicular to a cutting edge on the rake face and/or the flank face, the hardness at a point at a distance of 0.5 mm from a point at the cutting edge is more than 85%, suitably more than 90%, preferably more than 95%, of the hardness at the cutting edge, the Vickers hardness at the cutting edge being ≥3000 HV (15 mN load).

The hardness at a point at a distance of 0.5 mm from a point at the cutting edge is suitably up to 100% of the hardness at the cutting edge.

In one embodiment, the (Ti,Al)N layer shows a hardness distribution along a direction perpendicular to a cutting edge on the rake face and/or the flank face, the hardness at a point at a distance of 1 mm from a point at the cutting edge is more than 85%, suitably more than 90%, preferably more than 95%, of the hardness at the cutting edge, the Vickers hardness at the cutting edge being ≥3000 HV (15 mN load).

The hardness at a point at a distance of 1 mm from a point at the cutting edge is suitably up to 100% of the hardness at the cutting edge.

The (Ti,Al)N layer suitably has a plane strain modulus at the cutting edge of ≥475 GPa, preferably ≥490 GPa. The (Ti,Al)N layer has suitably a plane strain modulus at the cutting edge of 475-540 GPa, preferably 490-530 GPa.

The (Ti,Al)N layer suitably has a Vickers hardness at the cutting edge of ≥3200 HV (15 mN load), preferably ≥3500 HV (15 mN load). The (Ti,Al)N layer suitably has a Vickers hardness at the cutting edge of 3000-4400 HV (15 mN load), preferably 3500-4300 HV (15 mN load).

In one embodiment the (Ti,Al)N layer has a thickness of 0.1-15 μm, preferably 0.5-12 μm, most preferably 1-8 μm.

In one embodiment the (Ti,Al)N layer shows a distribution of 111 misorientation angles, a 111 misorientation angle being the angle between a normal vector to the surface of the (Ti,Al)N layer and the <111> direction that is closest to the normal vector to the surface of the (Ti,Al)N layer, a cumulative frequency distribution of the 111 misorientation angles is such that ≥60% of the 111 misorientation angles are less than 10 degrees.

If one excludes anti-parallel directions/planes (e.g., −1−1−1 is anti-parallel to 111), there are 4 unique {111}-type sets of planes in the cubic crystal structure ((111), (1−1−1), (−11−1), and (−1−11)). They stand in 70.5° angles to each other. If one of these planes is in parallel to the (Ti,Al)N surface, i.e., an ideal 111 orientation, the 111 misorientation angle would be 0° but there would be other {111}-type planes still having a larger angle to the normal vector of the surface than the 0° misorientation angle. The 111 misorientation angle as herein meant is the smallest angle, i.e., the angle between a normal vector to the (Ti,Al)N layer and the <111> direction that is closest to the normal vector to the (Ti,Al)N layer.

The distribution of 111 misorientation angles can be determined in an electron backscatter analysis (EBSD). However, the columnar grain width is generally increasing by increasing thickness of the (Ti,Al)N layer, especially for the first micrometers of the (Ti,Al)N layer and EBSD analysis may not be suitable if the grain width is too small. Therefore, in the case of having a (Ti,Al)N layer of a thickness of 2 μm or less the distribution of 111 misorientation angles is preferably determined in an transmission electron microscope (TEM) analysis, if the grain size is regarded to be too small for EBSD analysis. The EBSD or TEM analysis is made within a distance of 0.7 mm from the cutting edge.

The cumulative frequency distribution of the 111 misorientation angles is such that suitably ≥75%, preferably ≥90%, of the 111 misorientation angles are less than 10 degrees.

The cumulative frequency distribution of the 111 misorientation angles is such that suitably from 75 to 97%, preferably from 90 to 95%, of the 111 misorientation angles are less than 10 degrees.

The (Ti,Al)N layer suitably has an overall atomic ratio Al/(Ti+Al) of 0.70-0.85, preferably 0.70-0.80, most preferably 0.72-0.76.

In one embodiment the (Ti,Al)N layer is a single monolithic layer.

In one embodiment the (Ti,Al)N layer is a multilayer of two or more alternating (Ti,Al)N sub-layer types different in their composition of which at least one (Ti,Al)N sub-layer type has atomic ratio Al/(Ti+Al) of 0.50-0.67, preferably 0.55-0.67, most preferably 0.60-0.67, and at least one (Ti,Al)N sub-layer type has an atomic ratio Al/(Ti+Al) of 0.70-0.90, preferably 0.75-0.90, most preferably 0.75-0.85.

In one embodiment the (Ti,Al)N layer is a multilayer of one or two (Ti,Al)N sub-layer type/types having an atomic ratio Al/(Ti+Al) of 0.50-0.67, preferably 0.55-0.67, most preferably 0.60-0.67 alternating with one or two (Ti,Al)N sub-layer type/types having an atomic ratio Al/(Ti+Al) of 0.70-0.90, preferably 0.75-0.90, most preferably 0.75-0.85.

In a preferred embodiment the (Ti,Al)N layer is a multilayer of one (Ti,Al)N sub-layer type having an atomic ratio Al/(Ti+Al) of 0.50-0.67, preferably 0.55-0.67, most preferably 0.60-0.67 alternating with one (Ti,Al)N sub-layer type having an atomic ratio Al/(Ti+Al) of 0.70-0.90, preferably 0.75-0.90, most preferably 0.75-0.85.

A (Ti,Al)N sub-layer type in a multilayer suitably has an average thickness of 1-100 nm, preferably 1.5-50 nm, most preferably 2-20 nm.

In one embodiment, the ratio between the average thicknesses of the different (Ti,Al)N sublayer types is from 0.5 to 2, preferably from 0.75 to 1.5.

In one embodiment, the (Ti,Al)N layer is of a single phase cubic B1 crystal structure, at least over a distance of 0.5 mm, preferably at least over a distance of 1 mm, from a point at the cutting edge along a direction perpendicular to a cutting edge on the rake face and/or the flank face.

The determination of crystal structure or structures present in the (Ti,Al)N layer is suitably made by X-ray diffraction analysis, alternatively TEM analysis.

In one embodiment, the (Ti,Al)N layer, within 1 mm from the cutting edge, shows in X-ray diffraction analysis, or in TEM analysis, only cubic (Ti,Al)N reflections.

In one embodiment, the (Ti,Al)N layer has an average columnar grain width, measured at a distance of up to 2 μm from the lower interface of the (Ti,Al)N layer, of less than 175 nm, preferably less than 150 nm.

In one embodiment, the (Ti,Al)N layer has an average columnar grain width, measured at a distance of up to 2 μm from the lower interface of the (Ti,Al)N layer, of 80-175 nm, preferably 100-150 nm.

In one embodiment, below the (Ti,Al)N layer, there is an innermost layer of the coating, directly on the substrate, of a nitride of one or more elements belonging to group 4, 5 or 6 of the periodic table of elements, or a nitride of Al together with one or more elements belonging to group 4, 5 or 6 of the periodic table of elements. This innermost layer may at least partly act as a bonding layer to the substrate increasing the adhesion of the overall coating to the substrate. Such a bonding layer are commonly used in the art and a skilled person would choose a suitable one. Preferred alternatives for this innermost layer are TiN and $(Ti_{1-x}Al_x)N$, x being suitably >0 but ≤0.67. The thickness of this innermost layer is suitably less than 3 μm. The thickness of this innermost layer is in one embodiment 0.1-3 μm, preferably 0.2-1 μm. In one embodiment, there is one or more other layers commonly used in coatings for cutting tools combined with the (Ti,Al)N layer of the present invention. For example, nitrides of one or more elements belonging to group 4, 5 or 6 of the periodic table of elements, or nitrides of Al together with one or more elements belonging to group 4, 5 or 6 of the periodic table of elements. For example, a layer of $(Ti_{1-y}Al_y)N$, y being suitably >0 but ≤0.67.

In one embodiment, the coating comprises an inner layer of $(Ti_{1-y}Al_y)N$, $0.25 \leq y \leq 0.67$, of a thickness 0.5-3 μm, followed by a (Ti,Al)N layer of the present invention of a thickness of 0.5-5 μm.

The (Ti,Al)N layer according to the invention is deposited by PVD, i.e., the (Ti,Al)N layer is a PVD layer. Suitably, the (Ti,Al)N layer is a PVD layer deposited by a sputtering process, preferably a High-Power Impulse Magnetron Sputtering (HIPIMS)-deposited layer.

The substrate of the coated cutting tool can be of any kind common in the field of cutting tools for metal machining. The substrate is suitably selected from cemented carbide, cermet, cubic boron nitride (cBN), ceramics, polycrystalline diamond (PCD) and high speed steel (HSS).

In one preferred embodiment, the substrate is cemented carbide.

The coated cutting tool is suitably in the form of an insert, a drill or an end mill.

BRIEF DESCRIPTIONS OF THE DRAWINGS

Figure 5:
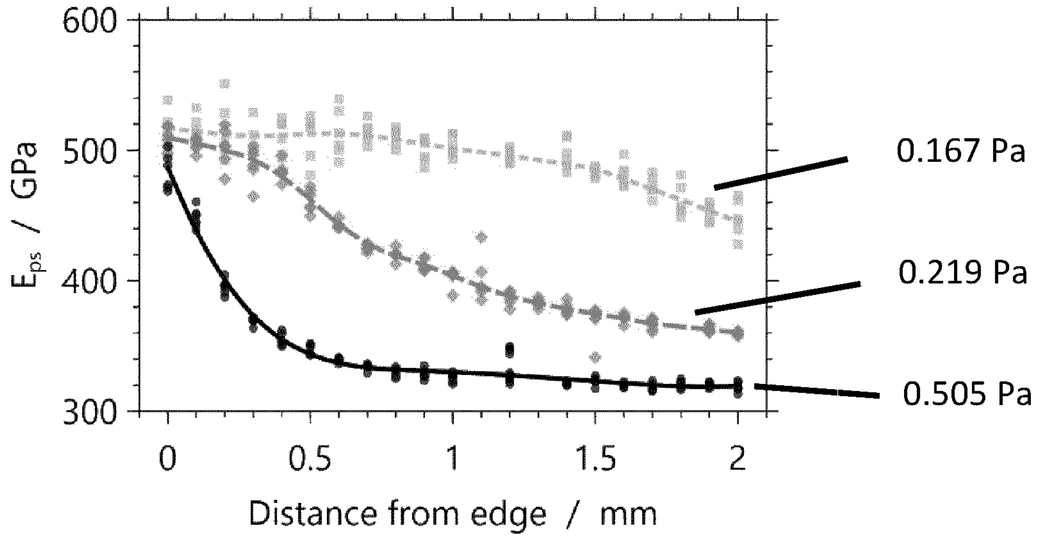

FIG. 5 refers to Example 1 and shows a hardness distribution along a distance from the cutting edge for (Ti,Al)N coatings deposited at different total pressure.

Figure 6:
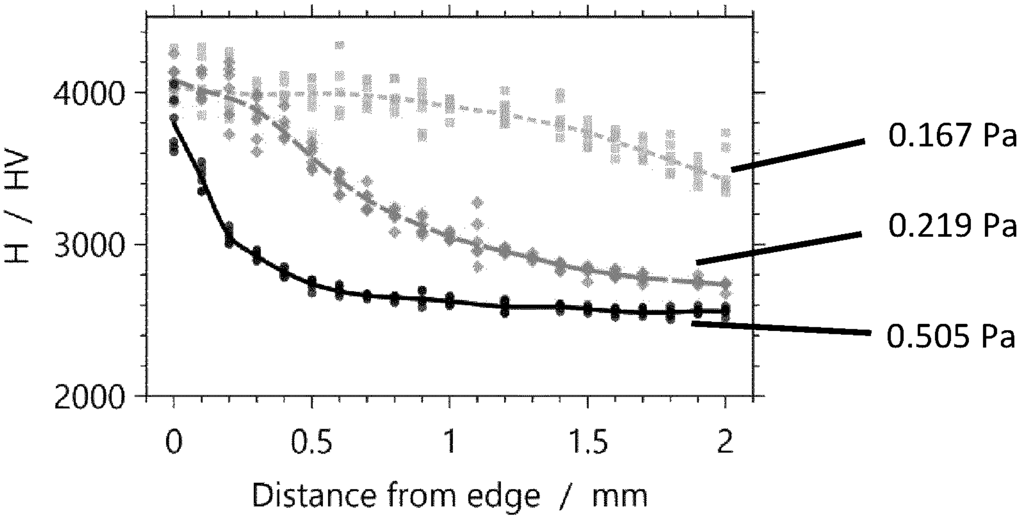

FIG. 6 refers to Example 1 and shows a plane strain modulus distribution along a distance from the cutting edge for (Ti,Al)N coatings deposited at different total pressure.

Figure 7:
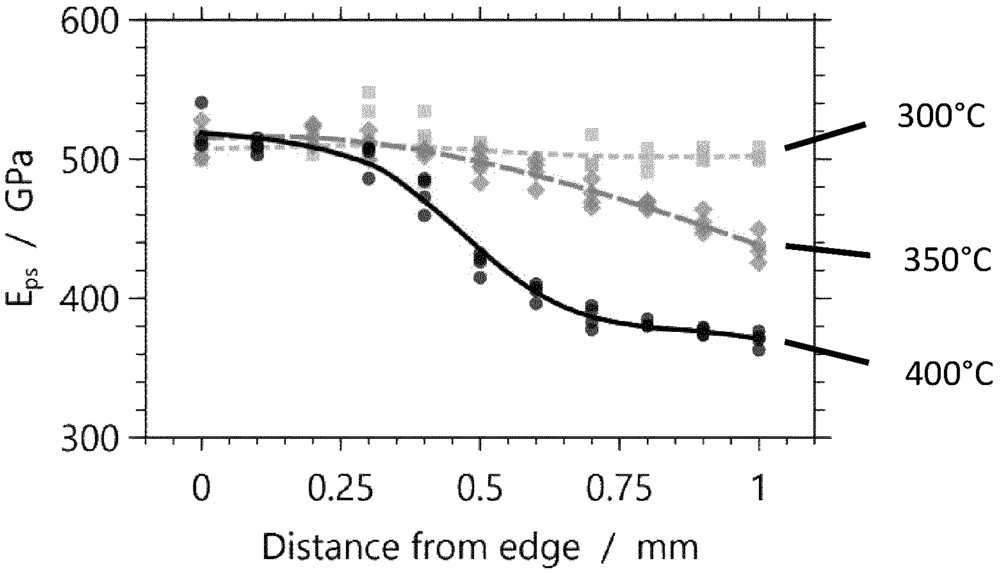

FIG. 7 refers to Example 2 and shows a plane strain modulus distribution along a distance from the cutting edge for (Ti,Al)N coatings deposited at different temperatures.

Figure 8:
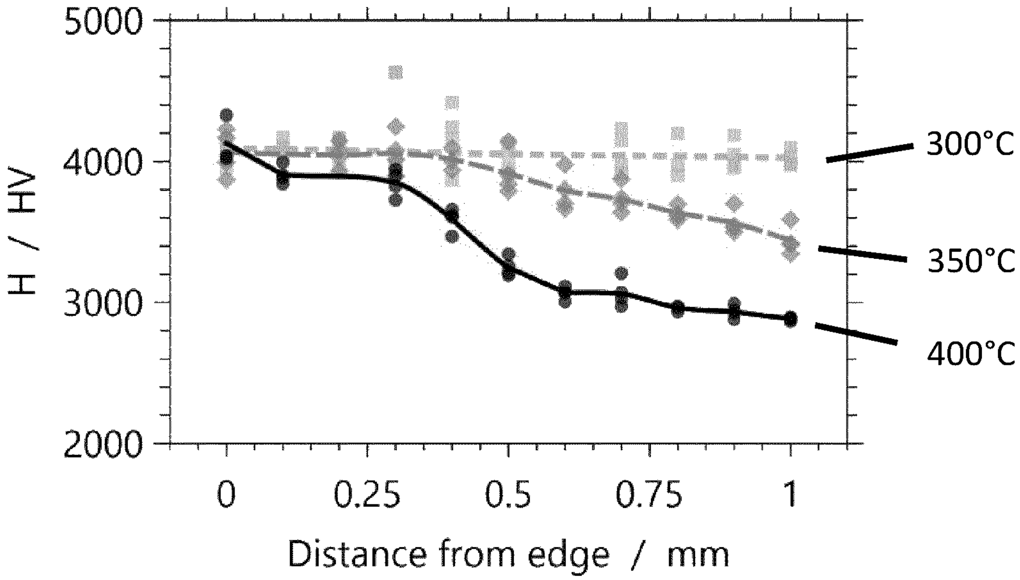

FIG. 8 refers to Example 2 and shows a hardness distribution along a distance from the cutting edge for (Ti,Al)N coatings deposited at different temperatures.

Figure 9:
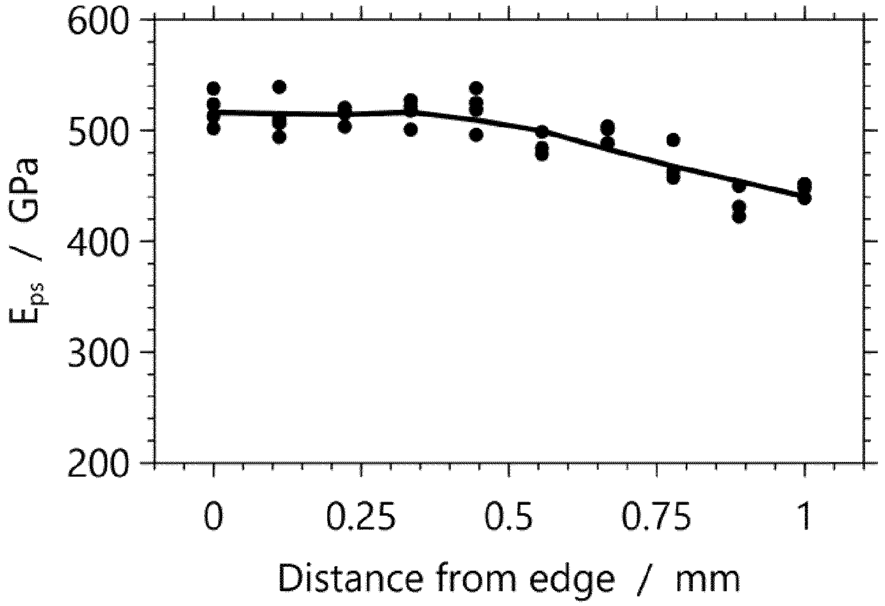

FIG. 9 refers to Example 4 and shows a plane strain modulus distribution along a distance from the cutting edge for a single monolithic layer (Ti,Al)N coating, “Sample 6”.

Figure 10:
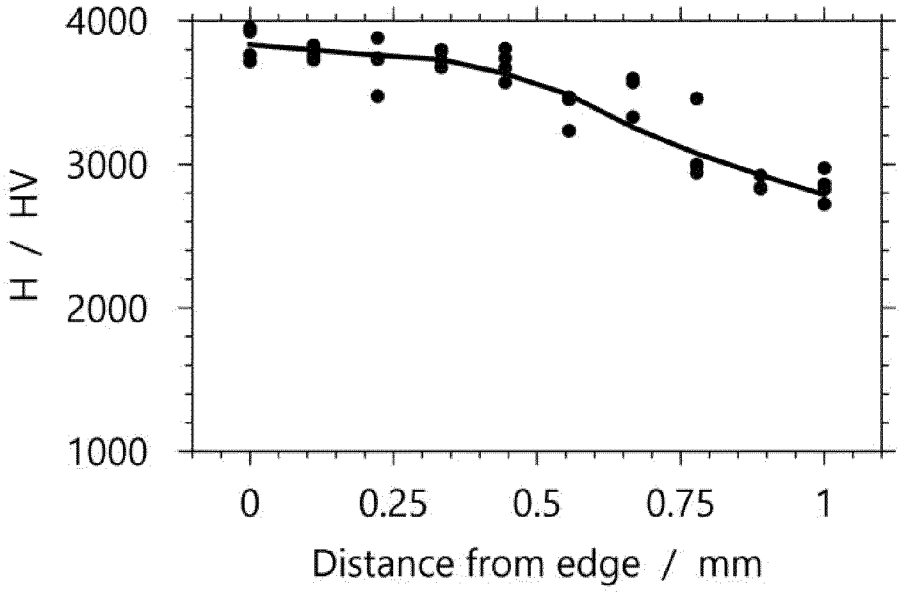

FIG. 10 refers to Example 4 and shows a hardness distribution along a distance from the cutting edge for a single monolithic layer (Ti,Al)N coating, “Sample 6”.

Figure 11:
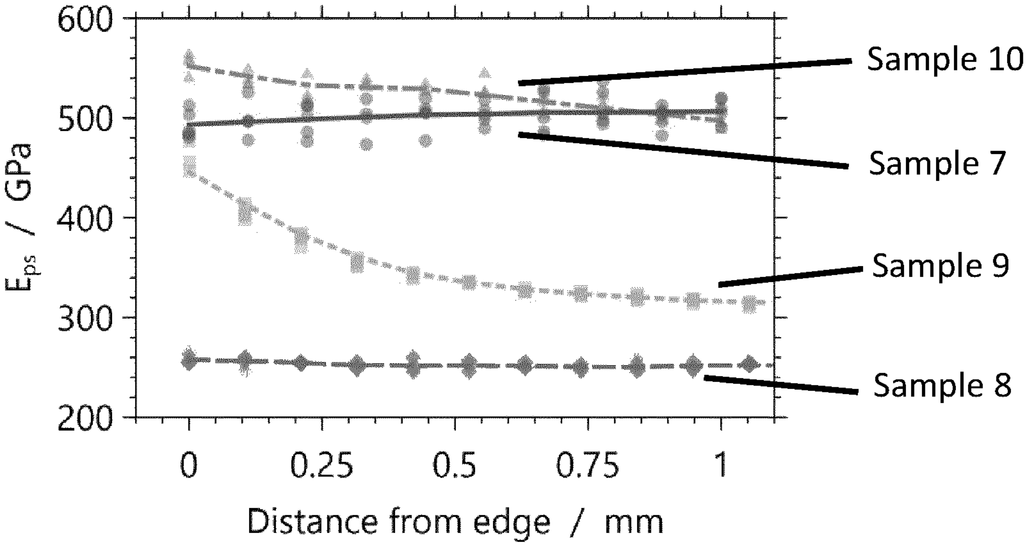

FIG. 11 refers to Example 5 and shows the distribution of plane strain modulus along a distance from the cutting edge for reference (Ti,Al)N coatings “Sample 7”, “Sample 8” and “Sample 9” as well as a (Ti,Al)N coating according to the invention, “Sample 10”, as measured on the rake face.

Figure 12:
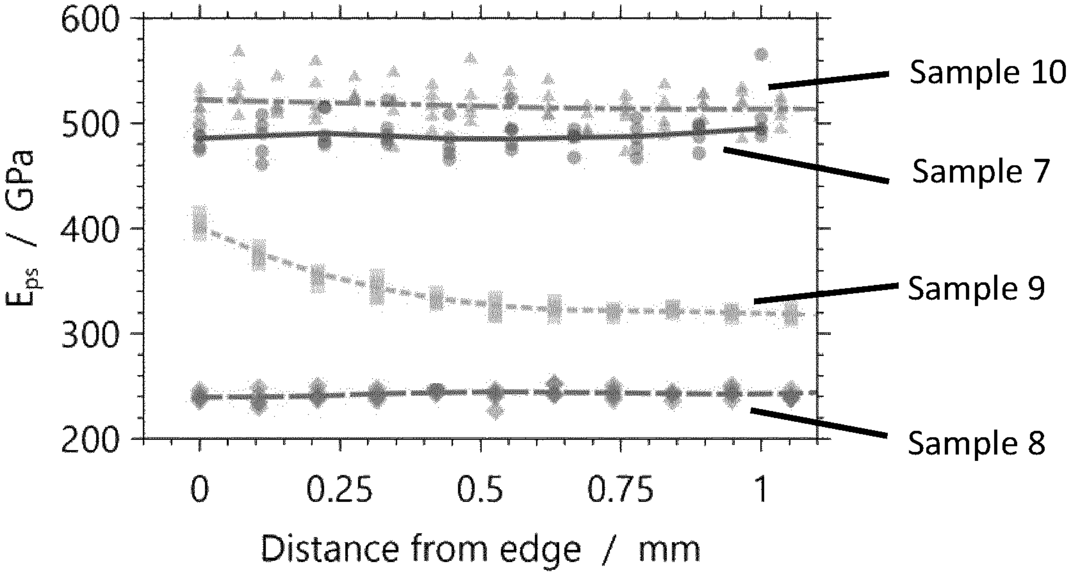

FIG. 12 refers to Example 5 and shows the distribution of plane strain modulus along a distance from the cutting edge for “Sample 7”, “Sample 8” and “Sample 9” as well as a (Ti,Al)N coating according to the invention, “Sample 10”, as measured on the flank face.

Figure 13:
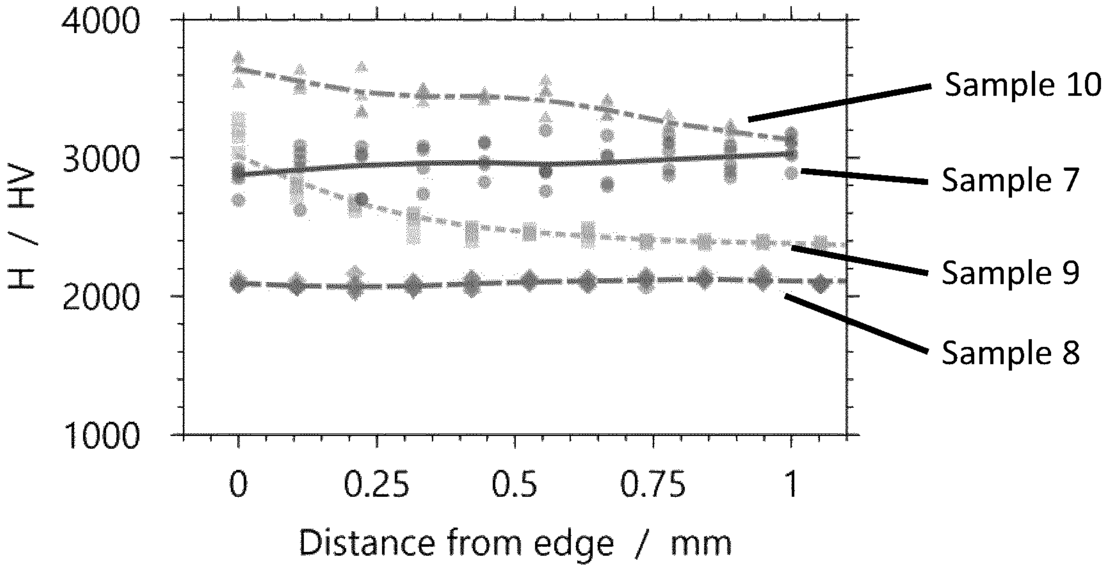

FIG. 13 refers to Example 5 and shows the distribution of hardness along a distance from the cutting edge for reference (Ti,Al)N coatings “Sample 7”, “Sample 8” and “Sample 9” as well as a (Ti,Al)N coating according to the invention, “Sample 10”, as measured on the rake face.

Figure 14:
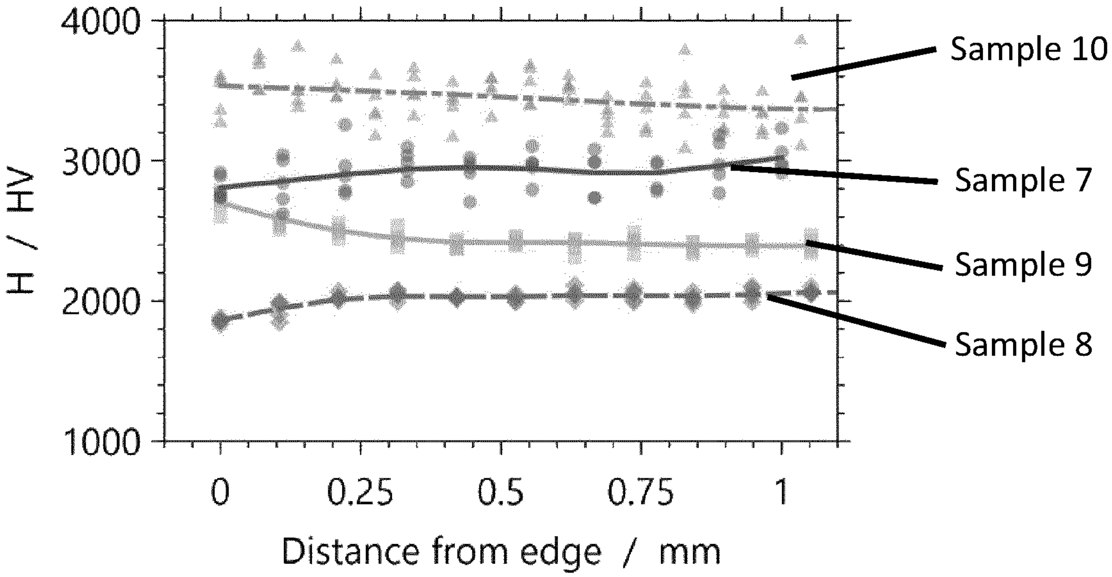

FIG. 14 refers to Example 5 and shows the distribution of hardness along a distance from the cutting edge for reference (Ti,Al)N coatings “Sample 7”, “Sample 8” and “Sample 9” as well as a (Ti,Al)N coating according to the invention, “Sample 10”, as measured on the flank face.

Figure 15:
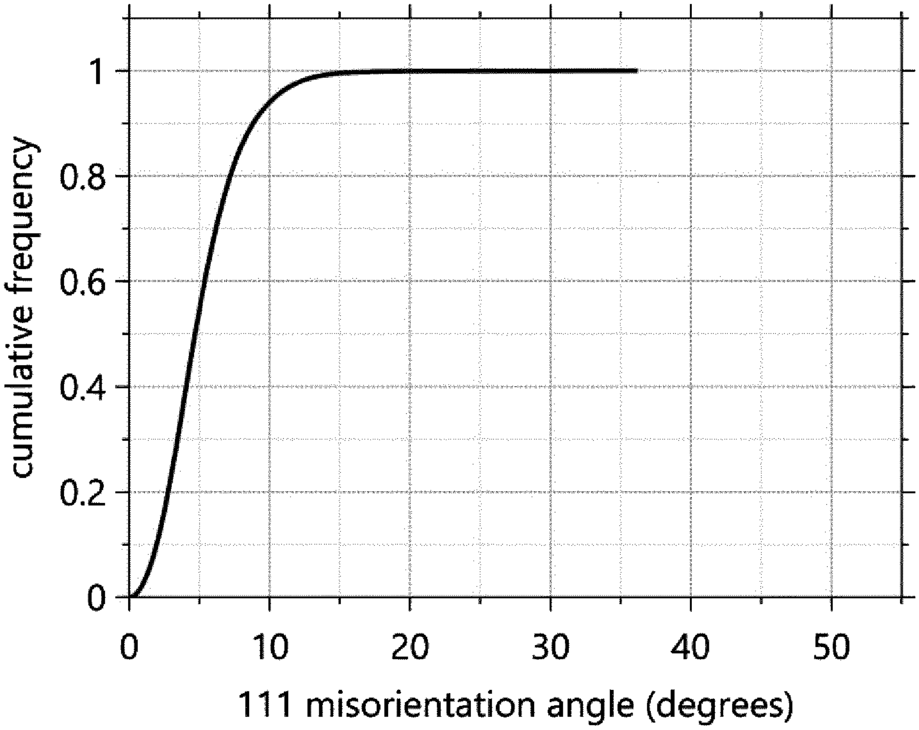

FIG. 15 shows a frequency distribution curve of 111 misorientation angles from electron backscatter diffraction (EBSD) analysis of an embodiment of the invention “Sample 2a (invention)”.

Figure 16:
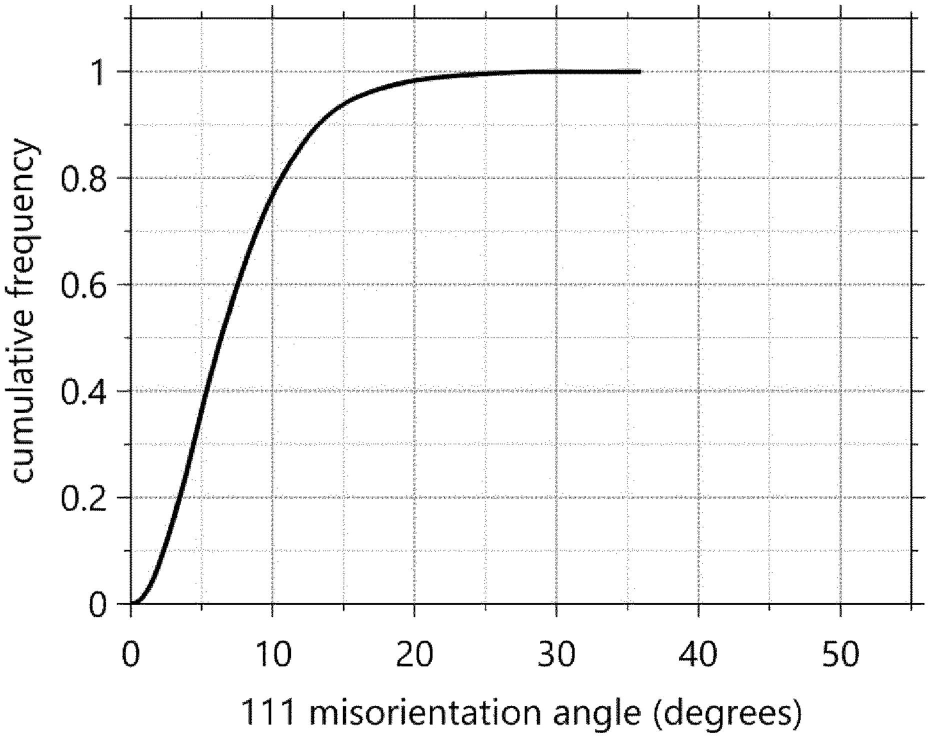

FIG. 16 shows a frequency distribution curve of 111 misorientation angles from electron backscatter diffraction (EBSD) analysis of an embodiment of the invention “Sample 6 (invention)”.

Figure 17:
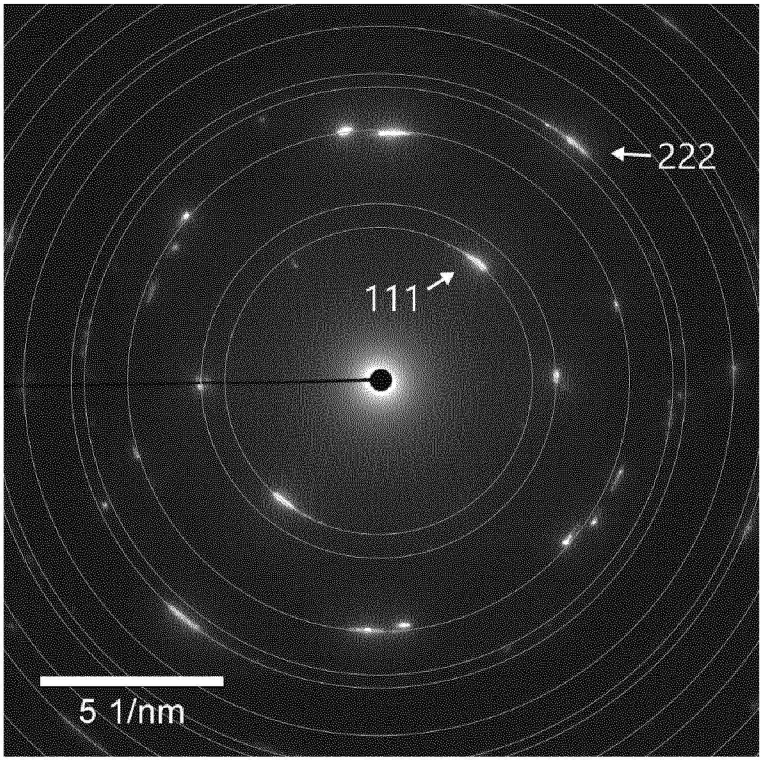

FIG. 17 shows a transmission electron microscope (TEM) electron diffraction pattern for the (Ti,Al)N layer of an embodiment of the invention “Sample 2a (invention)”.

DETAILED DESCRIPTION OF EMBODIMENTS IN DRAWINGS

Figure 1:
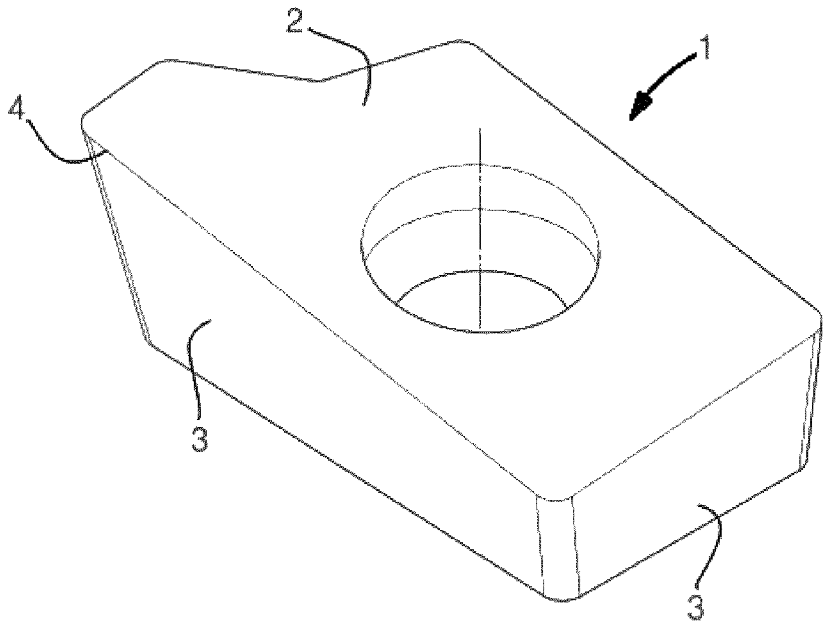
FIG. 1 shows a schematic view of one embodiment of a cutting tool being a milling insert.
Figure 2:
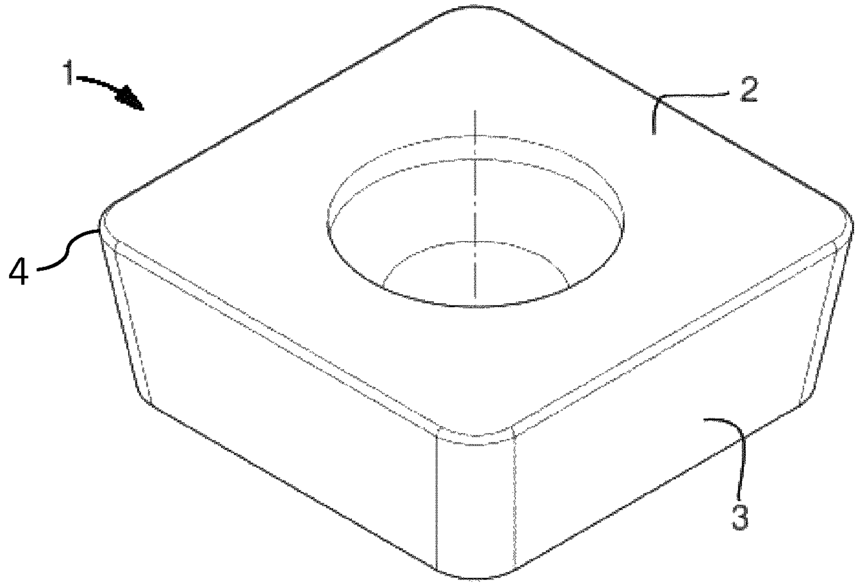
FIG. 2 shows a schematic view of one embodiment of a cutting tool being a turning insert.

FIG. 1 shows a schematic view of one embodiment of a cutting tool (1) having a rake face (2), a flank face (3) and a cutting edge (4). The cutting tool (1) is in this embodiment a milling insert. FIG. 2 shows a schematic view of one embodiment of a cutting tool (1) having a rake face (2), a flank face (3) and a cutting edge (4). The cutting tool (1) is in this embodiment a turning insert.

Figure 3:
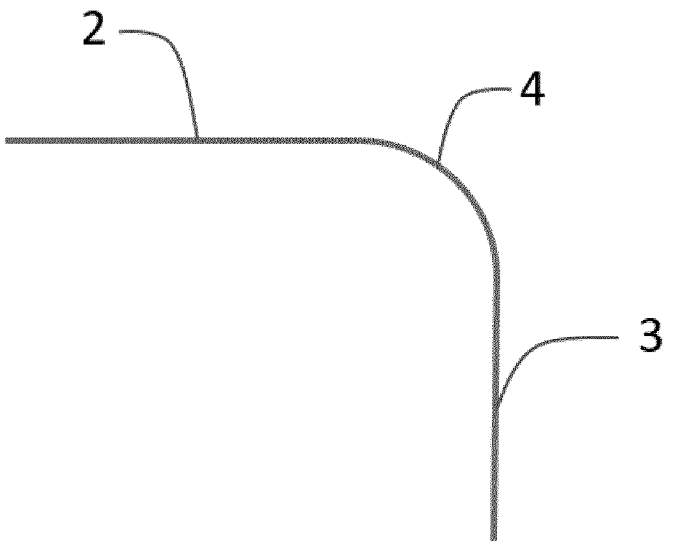
FIG. 3 shows a schematic view of one embodiment of a cutting tool around the cutting edge.

FIG. 3 shows a schematic view of an embodiment of a cutting tool around the cutting edge. The cutting edge (4) is located at the intersection of the rake face (2) and the flank face (3). In a cross sectional view the cutting edge (4) has a rounding.

Figure 4:
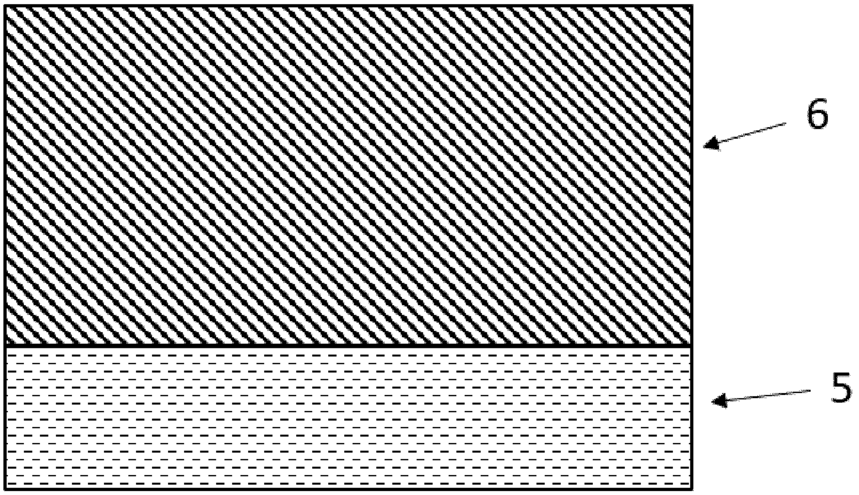
FIG. 4 shows a schematic view of a cross section of an embodiment of the coated cutting tool of the present invention showing a substrate and a coating.

FIG. 4 shows a schematic view of a cross section of an embodiment of the coated cutting tool of the present invention having a substrate body (5) and a (Ti, Al)N coating (6).

METHODS

Electron Back Scattering Diffraction (EBSD):

The EBSD measurements were performed on the flank face of the cutting tool samples at a distance of 50 μm from the cutting edge.

Prior to the EBSD scans the respective sample surfaces were carefully polished using a colloidal silica suspension with a nominal grain size of 40 nm (Struers OPS 0.04 μm). This step serves to remove any roughness present on the as deposited coating surface. No more than 100 nm of the top coating is removed by this procedure.

If the (Ti,Al)N layer would not have been the uppermost layer of the coating, a suitable method, such as polishing, is used for removing the layer(s) situated above the (Ti,Al)N layer, in order to eventually provide a polished (Ti,Al)N surface for the EBSD scans.

The electron diffraction patterns were acquired in a Zeiss CrossBeam 540 FIB-SEM (Carl Zeiss AG, Oberkochen, Germany) in conjunction with an EDAX DigiView 5 EBSD camera (EDAX Inc., Mahwah NJ, USA) at a standard sample tilt of 70° and a working distance of 5 mm. An e-beam acceleration voltage of 10 to 13 kV was used for the acquisition. The step size for the mappings was 20 nm. The mapping area was 15.00×11.25 μm.

Indexed via the EDAX TEAM software, the determined crystal orientation data was further evaluated using the EDAX OIM Analysis software.

A cumulative frequency distribution of 111 misorientation angles was calculated as follows: For each spot measurement of the total EBSD scan (representing an incremental surface area of the overall analyzed surface region) the crystallographic direction perpendicular to the surface plane of the (Ti,Al)N layer, is derived from the absolute crystallographic orientation measured (i.e. the orientation data in Euler angles).

Subsequently, the vector angle between this crystallographic direction and the closest <111>-type direction is calculated. Where "closest" refers to the <111>-type direction (among all four crystallographically equivalent possibilities) that includes the smallest possible angle with the surface normal. This angle is defined as the 111 misorientation angle. As each measurement point constitutes an equal fraction of the analyzed area the relative frequency distribution of these angular misorientation values characterizes the overall degree of the 111 surface texture.

Electron Diffraction in Transmission Electron Microscopy (TEM):

In the electron diffraction analysis made herein these are TEM measurements which were carried out using a Transmission Electron Microscope: JEOL ARM 200F microscope, 200 kV. Only the coating should contribute to the diffraction pattern by using a selected area aperture. The TEM was operated with parallel illumination for the diffraction in a selected area electron diffraction (SAED) procedure.

The samples were analysed in cross-section, i.e., the incident electron beam was parallel to the film plane. To rule out an amorphisation during sample preparation different methods can be used, i) classical preparation including mechanical cutting, gluing, grinding and ion polishing and ii) using a FIB to cut the sample and make a lift out to make the final polishing. The position of the analysis was near the substrate, about 200 nm from the substrate.

SAED data were obtained for the samples. From the SAED data a diffraction intensity profile was provided along the 111 ring that is centered around the angular position that corresponds to the coating normal. Then normalized integrations were made both at the 111 diffraction spot and the −1−1−1 diffraction spot, respectively, going to 45 degrees misorientation angle. The two integrations were combined into one intensity distribution curve. The intensity distribution data from both the 111 diffraction spot and the −1−1−1 diffraction spot were used in order to increase the number of data points thereby reducing the signal to noise ratio as much as possible.

The intensity at a certain misorientation angle is directly proportional to the sample volume that exhibits this misorientation. Thus, the intensity distribution curve is equivalent to the distribution of 111 misorientation angles. Then, correspondingly, a cumulative intensity curve obtained from the intensity distribution curve is equivalent to a cumulative frequency distribution of 111 misorientation angles.

X-Ray Diffraction:

The X-ray diffraction patterns were acquired by Grazing incidence mode (GID) on a diffractometer from Seifert/GE (PTS 3003). Cu-Kα-radiation with a polycapillary lens (for producing a parallel beam) was applied for the analysis (high tension 40 kV, current 40 mA). The incident beam was defined by a 0.5 mm pinhole. For the diffracted beam path an energy dispersive detector (Meteor OD) was used. The measurement was done in grazing incidence mode (Omega=4°). The 2theta range was about 20-80° with a step size of 0.03° and a counting time of 6 s.

Vickers Hardness:

The Vickers hardness was measured by means of nano indentation (load-depth graph) using a Picodentor HM500 of Helmut Fischer GmbH, Sindelfingen, Germany. For the measurement and calculation the Oliver and Pharr evaluation algorithm was applied, wherein a diamond test body according to Vickers was pressed into the layer and the force-path curve was recorded during the measurement. The maximum load used was 15 mN (HV 0.0015), the time period for load increase and load decrease was 20 seconds each. From this curve hardness was calculated.

Plane Strain Modulus:

The elastic properties of the coating samples were characterized by the so-called plane strain modulus Eps as derived by nanoindentation via the Oliver and Pharr method. The nano-indentation data was obtained from indentation as described for Vickers hardness above.

The distance 1 mm from the cutting edge used herein refers to a distance 1 mm from the beginning of the cutting edge (i.e., where the edge rounding begins)

Grain Width:

The average (Ti,Al)N grain width was determined through the evaluation of SEM cross-sections by the stereological line intersection method: A line grid is overlaid to a SEM micrograph and the intersections of the lines with the grain boundary network are marked. The statistics of the distances between adjacent intersections reflect the size of the three-dimensional grains (see, e.g., B. Ilschner, R. F. Singer, Werkstoffwissenschaften und Fertigungstechnik, Springer Berlin Heidelberg, 2016, ISBN: 978-3-642-53891-9). The SEM micrographs were taken at a distance of about 0.7 μm from the cutting edge, on the flank face.

EXAMPLES

Example 1 (Effect of Total Pressure)

A layer of (Ti,Al)N was deposited onto WC—Co based substrates using a target set-up of one target with the composition $Ti_{0.33}Al_{0.67}$ and one target with the composition $Ti_{0.20}Al_{0.80}$. The WC—Co based substrates were square-shaped inserts of flat geometry for easier analysis of the coating. The substrates had a composition of 8 wt % Co and balance WC.

HIPIMS mode was used in a Hauzer Flexicoat 1000 equipment. In three separate runs of depositions the total pressure was varied while keeping all other conditions the same. Three different total pressures were tested, 0.505 Pa, 0.219 Pa and 0.167 Pa. The intention was to study the influence of total pressure on hardness distribution and plane strain modulus distribution along a distance from the cutting edge.

The following process parameters were used:

| | | | |
|---|---|---|---|
| Temperature: | 300° C. | | |
| Average power: | 40 kW (20 kW per target) | | |
| Pulse duration: | 80 μs | | |
| Set peak current: | Target 1: 800 A, target 2: 800 A | | |
| DC pulse voltage: | 1800 V | | |
| Ar-Flow: | 500 sccm | 180 sccm | 130 sccm |
| Total pressure ($N_2$ + Ar): | 0.505 Pa (~167 sccm $N_2$) | 0.219 Pa (~115 sccm $N_2$) | 0.167 Pa (~108 sccm $N_2$) |
| Bias Potential: | −100 V | | |

(Ti,Al)N layers with a thickness of about 1.75 μm were deposited. From the substrate rotation speed an average thickness of a (Ti,Al)N sublayer was calculated to be about 3 nm.

The coated cutting tools provided are called "Sample 1" (0.505 Pa), "Sample 2" (0.219 Pa) and "Sample 3" (0.167 Pa).

Hardness measurements (load 15 mN) were carried out in the middle between two nose radiuses, from the edge between a rake face and a flank face in a direction perpendicular to the edge on the flank face of the coated cutting tools. Values of Vickers hardness and plane strain modulus (Eps) were determined. FIG. 5-6 show the results. It is seen that there is a relation between total pressure and the extension of high plane strain modulus and high hardness along a distance perpendicular to the cutting edge. Sample 2 and Sample 3 lie within the invention.

Example 2 (Effect of Temperature)

In order to study the effect of temperature on hardness distribution and plane strain modulus distribution along a distance from the cutting edge two further samples were made. A layer of (Ti,Al)N was deposited onto WC—Co based substrates using a target set-up of one target with the composition $Ti_{0.33}Al_{0.67}$ and one target with the composition $Ti_{0.20}Al_{0.80}$. The WC—Co based substrates were square-shaped inserts of flat geometry for easier analysis of the coating. The substrates had a composition of 8 wt % Co and balance WC.

HIPIMS mode was used in a Hauzer Flexicoat 1000 equipment. In two separate runs of depositions using a combination of a total pressure of 0.219 Pa and at a temperature of 350 and 400° C., respectively. All other process parameters were the same as used in Example 1, (Ti,Al)N layers with a thickness of about 1.75 μm were deposited. From the substrate rotation speed an average thickness of a (Ti,Al)N sublayer was calculated to be about 3 nm.

The coated cutting tools provided are called "Sample 4" and "Sample 5".

Hardness measurements (load 15 mN) were now carried out near a nose radius, from the cutting edge in a direction perpendicular to the cutting edge line on the flank face of the coated cutting tools "Sample 2", deposited at 300° C., "Sample 4", deposited at 350° C., and "Sample 5", deposited at 400° C. In this case the inserts have a nose radius of 1 mm and by "near a nose radius" is meant that the hardness measurements were made at the beginning of the nose radius. Values of plane strain modulus (Eps) and Vickers hardness were determined. FIG. 7 and FIG. 8 show the results.

It is seen that the lowest temperature, 300° C., gives an even level of Vickers hardness and plane strain modulus along a distance perpendicular to the cutting edge line while deposition at 350° C. or 400° C. gives a coating that shows declining Vickers hardness and plane strain modulus values when moving away from the cutting edge.

Sample 2 and Sample 4 lie within the invention.

Further Conclusions from Example 1 and Example 2

It should be noted that when comparing Sample 2 as measured in the middle between two nose radiuses (Example 1) and Sample 2 as measured near a nose radius (Example 2) one sees that for the same total pressure of 0.219 Pa a sustained high level of Vickers hardness and plane strain modulus along a distance from the cutting edge are provided near a nose radius but not along a distance from the edge in the middle of two nose radiuses. This is because, in addition to a concentration of the electrical field at the cutting edge, there is a corner effect at the nose radius in terms of a local concentration of the electrical field.

In a metal cutting process the important active area in a cutting process is the area near a nose radius. Thus, it is concluded that both "Sample 2" and "Sample 3" are samples within the present invention. "Sample 1" shows a very sharp decrease in hardness and plane strain modulus when going away from the edge and even if the measurement was made in the middle between two nose radiuses also a measurement near a nose radius gives a similar hardness and plane strain modulus distribution profile. "Sample 1" is therefore considered to be outside the present invention.

Example 3

A further sample corresponding to "Sample 2" (invention) was made with a higher thickness (7.3 μm). The process parameters were:

| | |
|---|---|
| Temperature: | 300° C. |
| Average power: | 40 kW (20 kW per target) |
| Pulse duration: | 80 μs |
| Set peak current: | Target 1: 800 A, target 2: 800 A |
| DC pulse voltage: | 1800 V |
| Ar-Flow: | 180 sccm |
| Total pressure ($N_2$ + Ar): | 0.22 Pa (~115 sccm $N_2$) |
| Bias Potential: | −110 V |

The coated cutting tool provided is called "Sample 2a".

Example 4

A layer of (Ti,Al)N, single monolithic layer, was deposited onto WC—Co based substrates using a target set-up of one target with the composition $Ti_{0.20}Al_{0.80}$. The WC—Co based substrates were inserts of flat geometry for easier analysis of the coating. The substrates had a composition of 8 wt % Co and balance WC.

HIPIMS mode was used in a Hauzer Flexicoat 1000 equipment.

The following process parameters were used:

| | |
|---|---|
| Temperature: | 200° C. |
| Average power: | 20 kW |
| Pulse duration: | 80 μs |
| Set peak current: | 800 A |
| DC pulse voltage: | 1800 V |
| Ar-Flow: | 150 sccm |
| Total pressure ($N_2$ + Ar): | 0.190 Pa (~88 sccm $N_2$) |
| Bias Potential: | −150 V |

A (Ti,Al)N layer with a thickness of about 1.7 μm was deposited on the inserts.

The coated cutting tools provided are called "Sample 6 (invention)".

FIG. 9 shows the distribution of plane strain modulus along a direction perpendicular to the cutting edge within 1 mm from a point at the cutting edge for "Sample 6", as measured on the flank face. The plane strain modulus at a point at a distance of 0.5 mm from a point at the cutting edge is about 97% of the plane strain modulus at the cutting edge. The plane strain modulus at a point at a distance of 1 mm from a point at the cutting edge is about 87% of the plane strain modulus at the cutting edge. FIG. 10 shows the distribution of hardness along a direction perpendicular to the cutting edge within 1 mm from a point at the cutting edge for "Sample 6", as measured on the flank face. The hardness at a point at a distance of 0.5 mm from a point at the cutting edge is about 93% of the hardness at the cutting edge. The hardness at a point at a distance of 1 mm from a point at the cutting edge is about 73% of the hardness at the cutting edge.

Example 5 (Comparisons with Ti40Al60N and Effect of Bias Increase Only)

Coated cutting tool inserts of three types were made as references wherein the coatings were either a $Ti_{0.40}Al_{0.60}N$ layer ("Sample 7"), a $Ti_{0.27}Al_{0.73}N$ layer deposited at std pressure and −40 V bias ("Sample 8") and a $Ti_{0.27}Al_{0.73}N$ layer deposited at std pressure and −110 V bias ("Sample 9"). The coatings were deposited onto WC—Co based substrates being flat inserts (for easier analysis of the coating) using HIPIMS mode in an Oerlikon Balzers equipment using S3p technology.

The substrates had a composition of 8 wt % Co and balance WC.

The deposition process was run in HIPIMS mode using the following process parameters

| | |
|---|---|
| Target material: | $Ti_{0.40}Al_{0.60}$ // $Ti_{0.27}Al_{0.73}$ |
| Target size: | 6 × circular, diameter 15 cm |
| Average power per target: | 9 kW |
| Peak pulse power: | 55 kW |
| Pulse on time: | 4 ms |
| Temperature: | 430° C. |
| Total pressure: | 0.61 Pa |
| Argon pressure: | 0.43 Pa |
| Bias potential: | −40 V (for sample with $Ti_{0.40}Al_{0.60}$ target and one sample with $Ti_{0.27}Al_{0.73}$ target) |
| Bias potential: | −110 V (for one sample with $Ti_{0.27}Al_{0.73}$ target) |

Each sample had a layer thickness of about 3 μm deposited.

The coated cutting tools provided were called "Sample 7", "Sample 8" and "Sample 9".

In addition a sample was made corresponding to Sample 2 (invention). HIPIMS mode was used in a Hauzer Flexicoat 1000 equipment.

The process parameters were:

| | |
|---|---|
| Temperature: | 300° C. |
| Average power: | 40 kW (20 kW per target) |
| Pulse duration: | 80 μs |
| Set peak current: | Target 1: 800 A, target 2: 800 A |
| DC pulse voltage: | 1800 V |
| Ar-Flow: | 180 sccm |
| Total pressure ($N_2$ + Ar): | 0.22 Pa (~115 sccm $N_2$) |
| Bias Potential: | −110 V |

A layer thickness of about 3 μm was deposited.

From the substrate rotation speed an average thickness of a (Ti,Al)N sublayer was calculated to be about 3 nm.

The coated cutting tool provided was called "Sample 10".

FIG. 11 shows the distribution of plane strain modulus along a direction perpendicular to the cutting edge within 1 mm from a point at the cutting edge for "Sample 7", "Sample 8", "Sample 9" and "Sample 10" as measured on the rake face.

FIG. 12 shows the distribution of plane strain modulus along a direction perpendicular to the cutting edge within 1 mm from a point at the cutting edge for "Sample 7", "Sample 8", "Sample 9" and "Sample 10" as measured on the flank face.

FIG. 13 shows the distribution of hardness along a direction perpendicular to the cutting edge within 1 mm from a point at the cutting edge for "Sample 7", "Sample 8", "Sample 9" and "Sample 10" as measured on the rake face.

FIG. 14 shows the distribution of hardness along a direction perpendicular to the cutting edge within 1 mm from a point at the cutting edge for "Sample 7", "Sample 8", "Sample 9" and "Sample 10" as measured on the flank face.

FIGS. 11-14 show the following:

As expected the "low-Al" $Ti_{0.40}Al_{0.60}N$ layer ("Sample 7") shows high plane strain modulus over a distance of at least 1 mm from the cutting edge. Also the Vickers hardness was high over this distance.

The $Ti_{0.27}Al_{0.73}N$ layer deposited at std pressure and −40 V bias voltage ("Sample 8") shows very low (≤250 GPa) plane strain modulus everywhere from the cutting edge and over a distance in a direction away from the cutting edge. Also the Vickers hardness is very low (about 2000 HV). This suggests an almost fully hexagonal coating which was also confirmed by XRD analysis.

The $Ti_{0.27}Al_{0.73}N$ layer deposited at std pressure and −110 V bias voltage ("Sample 9") shows a high plane strain modulus (about 460 GPa) on the cutting edge. Also, the Vickers hardness is high over this distance (about 2800 HV). However, both the hardness and plane strain modulus decreases over a distance in a direction away from the cutting edge. At a distance of 1 mm from the cutting edge the Vickers hardness is only about 2300 HV and the plane strain modulus is only about 320 GPa.

However, it is concluded that just increasing the bias voltage indeed provides a high hardness and high modulus structure for the $Ti_{0.27}Al_{0.73}N$ layer but only at the cutting edge so any coating as desired in the present invention is not provided.

The (Ti,Al)N layer according to the invention ("Sample 10"), however, shows a high level of plane strain modulus and hardness over the whole distance to 1 mm from the cutting edge.

Example 6

An even further sample according to the invention was made intended for testing in metal cutting. A first layer of 1.3 μm conventional $Ti_{0.40}Al_{0.60}N$ deposited by cathodic arc evaporation was provided onto a WC—Co based substrate followed by a 1.25 μm (Ti,Al)N layer very similar to the (Ti,Al)N layer of "Sample 2". The WC—Co based substrate was of two different milling insert geometries, SPMW12 and ADMT160608R-F56. The substrate had a composition of 8 wt % Co and balance WC.

The main purpose of the arc-evaporation deposited innermost layer is to improve adhesion to the substrate so that tool life is not limited by flaking. The two layers were made as follows:

Innermost layer of $Ti_{0.40}Al_{0.60}N$:

A 1.3 μm layer of $Ti_{0.40}Al_{0.60}N$ was deposited onto a WC—Co based substrate using a target with the composition $Ti_{0.40}Al_{0.60}$.

Arc mode was used in a Hauzer Flexicoat 1000 equipment. The deposition was run at total pressure 5 Pa, DC bias −40 V and temperature 580° C.

Layer of (Ti,Al)N:

A 1.25 μm layer of (Ti,Al)N was deposited onto the arc-deposited $Ti_{0.40}Al_{0.60}N$ layer using a target set-up of one target with the composition $Ti_{0.33}Al_{0.67}$ and one target with the composition $Ti_{0.20}Al_{0.80}$. HIPIMS mode was used in a Hauzer Flexicoat 1000 equipment.

The following process parameters were used:

| | |
|---|---|
| Temperature: | 300° C. |
| Average power: | 40 kW (20 kW per target) |
| Pulse duration: | 80 μs |
| Set peak current: | Target 1: 800 A, target 2: 800 A |
| DC pulse voltage: | 1800 V |
| Ar-Flow: | 180 sccm |
| Total pressure ($N_2$ + Ar): | 0.22 Pa (~115 sccm $N_2$) |
| Bias Potential: | −100 V |

From the substrate rotation speed an average thickness of a (Ti,Al)N sublayer was calculated to be about 3 nm.

The resulting coated cutting tool is called "Sample 11" (invention).

Table 1 shows a summary of the samples made.

TABLE 1

| | (Ti, Al)N layer in coating | Average composition | Comments |
|---|---|---|---|
| Sample 1 (comparative) | multi- $Ti_{0.33}Al_{0.67}N$/ $Ti_{0.20}Al_{0.80}N$ | $Ti_{0.27}Al_{0.73}N$ | 0.50 Pa, 300° C. |
| Sample 2 (invention) | multi- $Ti_{0.33}Al_{0.67}N$/ $Ti_{0.20}Al_{0.80}N$ | $Ti_{0.27}Al_{0.73}N$ | 0.22 Pa, 300° C. |
| Sample 3 (invention) | multi- $Ti_{0.33}Al_{0.67}N$/ $Ti_{0.20}Al_{0.80}N$ | $Ti_{0.27}Al_{0.73}N$ | 0.17 Pa, 300° C. |
| Sample 4 (invention) | multi- $Ti_{0.33}Al_{0.67}N$/ $Ti_{0.20}Al_{0.80}N$ | $Ti_{0.27}Al_{0.73}N$ | 0.22 Pa, 350° C. |
| Sample 5 (comparative) | multi- $Ti_{0.33}Al_{0.67}N$/ $Ti_{0.20}Al_{0.80}N$ | $Ti_{0.27}Al_{0.73}N$ | 0.22 Pa, 400° C. |
| Sample 6 (invention) | $Ti_{0.20}Al_{0.80}N$ | $Ti_{0.20}Al_{0.80}N$ | monolithic single layer |
| Sample 7 (comparative) | $Ti_{0.40}Al_{0.60}N$ | $Ti_{0.40}Al_{0.60}N$ | — |
| Sample 8 (comparative) | $Ti_{0.27}Al_{0.73}N$ | $Ti_{0.27}Al_{0.73}N$ | 0.61 Pa, −40 V |
| Sample 9 (comparative) | $Ti_{0.27}Al_{0.73}N$ | $Ti_{0.27}Al_{0.73}N$ | 0.61 Pa, −110 V |
| Sample 10 (invention) | multi- $Ti_{0.33}Al_{0.67}N$/ $Ti_{0.20}Al_{0.80}N$ | $Ti_{0.27}Al_{0.73}N$ | 0.22 Pa, 300° C. |
| Sample 11 (invention) | multi- $Ti_{0.33}Al_{0.67}N$/ $Ti_{0.20}Al_{0.80}N$ | $Ti_{0.27}Al_{0.73}N$ | 0.22 Pa, 300° C. |

Example 7 (Analysis)

XRD:

XRD analysis was made on "Sample 1 (comparative)", "Sample 2 (invention)", "Sample 3 (invention)", and "Sample 6 (invention").

All four samples show peaks from the cubic (111), (200) and (220) planes. However, "Sample 1 (outside invention)" in addition shows significant peaks at about 57 and 70 degrees 2theta, the peaks being the hexagonal (110) (hex AlN 57.29°), and one or both of (112) (hex AlN 68.85°) and (201) (hex AlN 69.98°).

XRD analysis was also made on "Sample 8 (comparative)". Significant hexagonal peaks were seen.

EBSD:

Electron backscatter diffraction (EBSD) analysis was made on "Sample 2a (invention)" and "Sample 6 (invention)". A cumulative frequency distribution of 111 misorientation angles was calculated, as described in the "Methods" section. FIG. 15 shows a frequency distribution curve of 111 misorientation angles from EBSD analysis of "Sample 2a (invention)".

For "Sample 2a (invention)" the (Ti,Al)N layer shows a cumulative frequency distribution of the 111 misorientation angles such that about 94% of the 111 misorientation angles are less than 10 degrees.

FIG. 16 shows a frequency distribution curve of 111 misorientation angles from EBSD analysis of "Sample 6 (invention)".

For "Sample 6 (invention)" the (Ti,Al)N layer shows a cumulative frequency distribution of the 111 misorientation angles such that about 77% of the 111 misorientation angles are less than 10 degrees.

TEM:

Transmission electron microscope (TEM) analysis was made on "Sample 2a" (invention) The diffraction pattern from "Sample 2a (invention)" is seen in FIG. 17 and shows distinct spots which means high crystallographic texture. The diffraction pattern shows a 111 textured layer.

TEM analysis on "Sample 2a" (invention) showed that the average thickness of each of the (Ti,Al)N sublayer types was about the same being about 3 nm.

EDX:

The average composition of the (Ti,Al)N layer of "Sample 2a" (invention) was proven to correspond to the expected values from target composition by Energy Dispersive X-Ray Spectroscopy (EDX) analysis. The average composition was $Ti_{0.27}Al_{0.73}N$, i.e., the (Ti,Al)N layer had an overall atomic ratio Al/(Ti+Al) of 0.73.

Grain Width:

The grain width was determined for "Sample 2a" (invention). The grain width was determined at distances from the lower interface to the substrate of 2, 4 and 6 μm. The average grain width values were 127, 165 and 247 nm, respectively.

Example 7

Cutting Test, ISO-P Milling:

"Sample 11" (invention) was further tested in an ISO-P milling test, and the flank wear was measured. In this test "Sample 11" (invention) was compared with a cutting insert known to be good in ISO-P milling.

The comparative coated tool was made by providing milling insert cemented carbide substrates of geometry SPMW12, having a composition of 8 wt % Co and balance WC, and depositing a coating according to the conditions below:

Innermost $Ti_{0.40}Al_{0.60}N$ layer:

| | |
|---|---|
| Target material: | $Ti_{0.40}Al_{0.60}$ |
| Target size: | 6 × circular, diameter 15 cm |
| Average power per target: | 9 kW |
| Peak pulse power: | 55 kW |
| Pulse on time: | 4 ms |
| Temperature: | 430° C. |
| Total pressure: | 0.61 Pa |
| Argon pressure: | 0.43 Pa |
| Bias potential: | −40 V |

A layer of 2.1 μm was deposited.

Outermost ZrN Layer:

| | |
|---|---|
| Target material: | Zr |
| Target size: | 3 × circular, diameter 15 cm |
| Average power per target: | 9 kW |
| Peak pulse power: | 27 kW |
| Pulse on time: | 26 ms |
| Temperature: | 430° C. |
| Total pressure: | 0.55 Pa |
| Argon pressure: | 0.43 Pa |
| Bias potential: | −40 V |

A layer of 0.2 μm was deposited.

The comparative samples were ones from commercial production. It comprises an upper thin ZrN layer of 0.2 μm deposited for the purpose of colour and easier wear detection. However, this additional layer does not influence the wear resistance in any substantial way.

The test conditions and test data are summarized below. As workpiece material steel (ISO-P) was used.

Test Conditions:

A milling test was performed at a cutting speed of 240 m/min. The other testing conditions are as follows:

Tool Geometry:

| | |
|---|---|
| Insert geometry: | SPMW12 |
| Tool diameter $D_c$: | 125 mm |
| Setting angle κ: | 45° |

Cutting Data:

| | |
|---|---|
| Contact width $a_e$: | 100 mm |
| Cutting depth $a_p$: | 3 mm |
| Cutting speed: | 240 m/min |
| Feed per tooth: | 0.2 mm |

Workpiece:

| | |
|---|---|
| Material | ISO-P steel, 42CrMoV4 type |
| Tensile strength | 785 MPa |
| Cutting fluid: | none, i.e. dry |

In this test the wear maximum was observed at the cutting edge on the flank side. Three cutting edges were tested of each sample and the averaged value for each cutting length is shown in Table 2.

TABLE 2

| | Cutting length (mm) | | | |
|---|---|---|---|---|
| Sample | 2000 | 3000 | 4000 | 4800 |
| "Sample 11" (invention) $VB_{max}$ [mm] | 0.09 | 0.11 | 0.12 | 0.14 |
| Comparative $VB_{max}$ [mm] | 0.10 | 0.13 | 0.18 | 0.22 |

The comparative sample has a coating known to give very good results in milling of ISO-P steel. Nevertheless, it is concluded that "Sample 10" (invention) performs much better than the comparative sample.

Example 8

Cutting Test, ISO-M Milling:

"Sample 11" (invention) was further tested in an ISO-M milling test, and the flank wear was measured. In this test "Sample 11" (invention) was compared with a cutting insert having an arc-deposited coating known to be good in ISO-M milling.

The comparative coated tool was made by providing milling insert cemented carbide substrates having a composition of 8 wt % Co and balance WC and depositing a coating according to the conditions below:

Innermost Multilayer $Ti_{0.50}Al_{0.50}N/Ti_{0.33}Al_{0.87}N$ Layer:

| | |
|---|---|
| Target material: | 1 × $Ti_{0.50}Al_{0.50}$/1 × $Ti_{0.33}Al_{0.67}$ |
| Temperature: | 550° C. |
| Total pressure: | 10 Pa |
| Bias potential: | −60 V |

A layer of 1.3 μm was deposited.

Outermost Multilayer $Ti_{0.50}Al_{0.50}N/Ti_{0.33}Al_{0.67}N$ Layer:

| | |
|---|---|
| Target material: | 1 × $Ti_{0.50}Al_{0.50}$/2 × $Ti_{0.33}Al_{0.67}$ |
| Temperature: | 550° C. |
| Total pressure: | 10 Pa |
| Bias potential: | −50 V |

A layer of 1.2 μm was deposited.

The test conditions and test data are summarized below. As workpiece material stainless steel (ISO-M) was used.

Test Conditions:

Tool Geometry:

| | |
|---|---|
| Insert geometry: | ADMT160608R-F56 |
| Tool diameter $D_c$: | 63 mm |
| Setting angle κ: | 90° |
| Number of teeth/inserts mounted: | 3 |

Cutting Data:

| | |
|---|---|
| Contact width $a_e$: | 50 mm |
| Cutting depth $a_p$: | 3 mm |
| Cutting speed: | 240 m/min |
| Feed per tooth: | 0.15 mm |

Workpiece:

| | |
|---|---|
| Material | 1.4571/V4A-stainless steel |
| Tensile strength | 720 MPa |
| Cutting fluid: | none, i.e. dry |

In this test the wear maximum was observed at the cutting edge on the flank side. Three cutting edges were tested of each coating and the averaged value for each cutting length is shown in Table 3.

TABLE 3

| | Cutting length (mm) | | | | |
|---|---|---|---|---|---|
| Sample | 1000 | 2000 | 3000 | 4000 | 5000 |
| "Sample 11" (invention) $VB_{max}$ [mm] | 0.04 | 0.06 | 0.07 | 0.08 | 0.10 |
| Comparative $VB_{max}$ [mm] | 0.08 | 0.09 | 0.11 | 0.12 | 0.16 |

The comparative sample has a coating known to give very good results in milling of stainless steel (ISO-M). Nevertheless, it is concluded that "Sample 11" (invention) performs much better than the comparative sample.

The invention claimed is:

1. A coated cutting tool having at least one rake face and at least one flank face and a cutting edge therebetween, the coated cutting tool comprising:

a substrate; and a coating, the coating including a (Ti,Al)N layer, the (Ti,Al)N layer being either a single monolithic layer or a multilayer of two or more alternating (Ti,Al)N sub-layer types having different compositions, the (Ti,Al)N layer having an overall atomic ratio Al/(Ti+Al) of >0.67 but ≤0.85, wherein the (Ti,Al)N layer shows a plane strain modulus distribution along a direction perpendicular to a cutting edge on the rake face and/or the flank face, the plane strain modulus at a point at a distance of at least 0.5 mm from a point at the cutting edge is at least more than 90% of the plane strain modulus at the cutting edge, the plane strain modulus at the cutting edge being ≥450 GPa.

2. The coated cutting tool according to claim 1, wherein the (Ti,Al)N layer shows a plane strain modulus distribution along the direction perpendicular to the cutting edge on the rake face and/or the flank face, the plane strain modulus at a point at a distance of 1 mm from a point at the cutting edge being more than 85% of the plane strain modulus at the cutting edge.

3. The coated cutting tool according to claim 1, wherein the (Ti,Al)N layer shows a hardness distribution along the direction perpendicular to the cutting edge on the rake face and/or the flank face, the hardness at the point at the distance of 0.5 mm from the point at the cutting edge is more than 70% of the hardness at the cutting edge, the Vickers hardness at the cutting edge being ≥3000 HV (15 mN load).

4. The coated cutting tool according to claim 1, wherein the (Ti,Al)N layer shows a hardness distribution along the direction perpendicular to the cutting edge on the rake face and/or the flank face, the hardness at a point at a distance of 1 mm from a point at the cutting edge being more than 70% of the hardness at the cutting edge, the Vickers hardness at the cutting edge being ≥3000 HV (15 mN load).

5. The coated cutting tool according to claim 1, wherein the (Ti,Al)N layer has a plane strain modulus at the cutting edge of ≥475 GPa.

6. The coated cutting tool according to claim 1, wherein the (Ti,Al)N layer has a Vickers hardness at the cutting edge of 3500-4300 HV (15 mN load).

7. The coated cutting tool according to claim 1, wherein the (Ti,Al)N layer has a thickness of from 0.1 to 15 μm.

8. The coated cutting tool according to claim 1, wherein the (Ti,Al)N layer shows a distribution of 111 misorientation angles, a 111 misorientation angle being the angle between a normal vector to the surface of the (Ti,Al)N layer and the <111> direction that is closest to the normal vector to the surface of the (Ti,Al)N layer, a cumulative frequency distribution of the 111 misorientation angles being such that ≥60% of the 111 misorientation angles are less than 10 degrees.

9. The coated cutting tool according to claim 1, wherein the (Ti,Al)N layer has an overall atomic ratio Al/(Ti+Al) of 0.70-0.80.

10. The coated cutting tool according to claim 1, wherein the (Ti,Al)N layer is a single monolithic layer.

11. The coated cutting tool according to claim 1, wherein the multilayer of two or more alternating (Ti,Al)N sub-layer types having different compositions has at least one (Ti,Al)N sub-layer type having an atomic ratio Al/(Ti+Al) of 0.50-0.67 and at least one (Ti,Al)N sub-layer type having an atomic ratio Al/(Ti+Al) of 0.70-0.90.

12. The coated cutting tool according to claim 11, wherein the (Ti,Al)N sub-layer type in a multilayer has an average thickness of 1-100 nm.

13. The coated cutting tool according to claim 1, wherein the (Ti,Al)N layer is of a single phase cubic B1 crystal structure, at least over a distance of 1 mm from the point at the cutting edge along the direction perpendicular to the cutting edge on the rake face and/or the flank face.

14. The coated cutting tool according to claim 1, wherein the substrate is selected from cemented carbide, cermet, cubic boron nitride (cBN), ceramics, polycrystalline diamond (PCD) and high speed steel (HSS).

15. The coated cutting tool according to claim 1, which is an insert, a drill or an end mill.

* * * * *